(12) United States Patent
Okamoto

(10) Patent No.: US 7,746,161 B2
(45) Date of Patent: Jun. 29, 2010

(54) SEMICONDUCTOR INTEGRATED CIRCUIT DEVICE HAVING INTERNAL VOLTAGE GENERATING CIRCUIT

(75) Inventor: Toshiharu Okamoto, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 105 days.

(21) Appl. No.: 11/984,051

(22) Filed: Nov. 13, 2007

(65) Prior Publication Data

US 2008/0122527 A1 May 29, 2008

(30) Foreign Application Priority Data

Nov. 28, 2006 (JP) ............... 2006-320280

(51) Int. Cl.
 *G05F 1/10* (2006.01)
(52) U.S. Cl. .................. 327/538; 327/541; 327/543
(58) Field of Classification Search ......... 327/108, 327/309, 382, 538, 541, 543
See application file for complete search history.

(56) References Cited

U.S. PATENT DOCUMENTS 6,603,334 B1 * 8/2003 Takahashi .......... 327/108
6,744,300 B2 * 6/2004 Taguchi et al. ........ 327/543

FOREIGN PATENT DOCUMENTS

JP 2004-334583 11/2004
JP 2005-353186 12/2005

* cited by examiner

*Primary Examiner*—Long Nguyen
(74) *Attorney, Agent, or Firm*—McGinn IP Law Group, PLLC

(57) ABSTRACT

A semiconductor device includes a first voltage generator which outputs a first signal to a first node, a second voltage generator which outputs a second signal to a second node, a capacitor coupled between the first and second nodes; and a current supply circuit coupled to said second node. While the first voltage generator outputs the first signal to set the first node to a first voltage potential, the second voltage generator is activated to output the second signal to set the second node to a second voltage potential. At that time, the capacitor influences to the second node, based on a coupling capacitance thereof and the current supplying circuit supplies a current to suppress the influence.

23 Claims, 4 Drawing Sheets

SEMICONDUCTOR INTEGRATED CIRCUIT DEVICE HAVING INTERNAL VOLTAGE GENERATING CIRCUIT

BACKGROUND OF THE INVENTION

1. Field of the Invention

The present invention relates to a semiconductor integrated circuit device, and particularly to a semiconductor integrated circuit device having an internal voltage generating circuit.

2. Description of Related Art

In some cases, a semiconductor integrated circuit device uses a plurality of internal voltages different from an external power supply voltage (hereinafter referred to as VCC) for ensuring the reliability, reducing power consumptions, ensuring operations, and so on. These internal voltages include a variety of types, such as a positive internal voltage lower than VCC, a positive internal voltage higher than VCC and a negative internal voltage lower than an external ground voltage (hereinafter referred to as GND). These internal voltages are generated by their corresponding internal voltage generating circuits, and driven into a predetermined voltage with the charge of parasitic and stabled capacitances formed within a semiconductor substrate. Furthermore, it is necessary to complete a setup operation at the time of setup such as power-on of the semiconductor integrated circuit device so that these internal voltages reach a predetermined electric potential within a time period defined by specifications.

For the semiconductor integrated circuit device, for example a DRAM which is one type of semiconductor storage device, a memory cell comprises one cell transistor and one cell capacitor. An internal voltage VBB for a back gate bias (hereinafter referred to as VBB), which is a negative voltage, is applied to a back gate region of the cell transistor. An internal voltage VPLT for a cell plate (hereinafter referred to as VPLT) is applied to an opposite electrode of the cell capacitor. Furthermore, an internal voltage VBL for precharge of a bit line pair (hereinafter referred to as VBL), an internal voltage VPP for setting of a word line (hereinafter referred to as VPP), which is higher in electric potential than VCC, as a selection voltage for a word line, and an internal voltage VNN for reset of a word line (hereinafter referred to as VNN), which is at a negative electric potential, as a non-selection voltage for a word line are used.

Internal voltages used in a memory core region on which memory cells are formed, for example VBB, VPLT, VBL, VPP, VNN are driven into a predetermined voltage by charging a parasitic capacitance between impurity diffusion regions within the memory core region. Furthermore, these internal voltages are mutually capacitive-coupled through the parasitic capacitance.

In order to generate a positive internal voltage higher than VCC and a negative internal voltage lower than GND as described above, the internal voltage is generally driven into a predetermined electric potential using a charge pump circuit comprising a capacitive element. There are various kinds of factors that determine the current drive capacity of the charge pump, but one of the major factors is the area of the capacitive element. The current drive capacity of the charge pump circuit is proportional to the area of the capacitive element. Therefore, for increasing the current drive capacity of the charge pump circuit, the area of the capacitive element included in the charge pump circuit may be increased. However, high integration is hindered because the block area of the charge pump circuit increases. Thus, it is necessary to make a design to decrease the current drive capacity of the charge pump circuit so that the circuit area becomes as small as possible while ensuring a necessary and sufficient capacity in consideration of loads on the charge pump circuit at the time of power-on setup operation, standby operation and active operation.

Incidentally, as the process has become precise and the capacity of memories has been increased in recent years, a parasitic capacitance to be charged within a memory core has increased, and accordingly, it has become necessary to increase the current drive capacity of the internal voltage generating circuit. For example, VBB is generated only by biasing the back gate region of the cell transistor to a negative voltage at the time of standby operation and active operation, and the VBB generating circuit may have a moderate current drive capacity capable of absorbing voltage variations by a leak current. However, at the time of power-on setup operation, a parasitic capacitance to be charged increases, and therefore a high current drive capacity corresponding to the parasitic capacitance is required.

When a design is made to increase the current drive capacity of the VBB generating circuit in accordance with the power-on setup operation, it is necessary to increase the capacitive element of the charge pump circuit, and the area of the circuit becomes so large that high integration is hindered. Conversely, when a design is made to decrease the current drive capacity of the VBB generating circuit in accordance with the standby operation, it may be impossible to complete the power-on setup operation so that a predetermined electric potential is reached within a time period defined by specifications. In this connection, explanations are presented here for VBB, but the same applies for internal voltages other than VBB.

Thus, a semiconductor integrated circuit device is known which drives (overdrive) VPLT and the like to be higher than an originally required electric potential at the time of power-on setup and then reduces, by a coupling capacitance, VBB connected to VPLT by the coupling capacitance at the time of drop in voltage after the overdrive (see, for example, Patent Documents 1 and 2). According to such a semiconductor integrated circuit device, a capacity of driving the internal voltage into a negative voltage at the time of power-on setup operation can be reinforced without increasing the drive capacity of the internal voltage generating circuit for VBB. Therefore, the drive capacity at the time of power-on setup can be reinforced without increasing the circuit scale of the VBB generating circuit itself, thus allowing the power-on setup of VBB in a short time.

[Patent Document 1] Japanese Patent Laid-Open No. 2004-334583 (FIG. 2)

[Patent Document 2] Japanese Patent Laid-Open No. 2005-353186 (FIGS. 4 and 15)

Incidentally, when a negative internal voltage and another negative internal voltage are mutually coupled by a parasitic capacitance, e.g. VBB and VNN are mutually coupled by a parasitic capacitance, Patent Document 2 discloses two types of methods for driving these internal voltages. FIG. 5 is a time chart showing a change in voltage waveform of each part of a semiconductor integrated circuit device according to a first method (corresponding to FIG. 15 of Patent Document 2). In FIG. 5, VPLT, VBB and VNN are fixed to GND until time T1. At time T1, VPLT is increased toward an electric potential V4 higher than a normal predetermined electric potential V5 (overdrive operation).

When VPLT reaches the electric potential V4 at time T2, the overdrive operation is stopped. In the overdrive operation at time T1 to T2, VBB and VNN are fixed to GND (clamp state).

At time T2 when VPLT reaches the electric potential V4, the clamp of VBB and VNN to GND is cancelled to reduce VPLT to the normal predetermined electric potential V5 (voltage drop state). VBB decreases from GND toward a negative voltage by capacitive coupling, since it is coupled through the coupling capacitance of VPLT and VBB. After time T2, VBB ultimately reaches a predetermined negative electric potential V7 due to depressing by the drive capacity of the VBB generating circuit itself and the coupling capacitance with VPLT (at time T3). After time T3, VBB is driven so as to be kept at the predetermined negative electric potential V7.

Furthermore, at time T2, a coupling capacitance exists between VNN and VBB, and therefore following a reduction in VBB, the electric potential of VNN decreases by capacitive coupling. VNN operates so that it reaches the negative electric potential V7 as in the case of VBB at time T3, and the electric potential of VNN after time T3 is kept at the negative electric potential V7 as in the case of VBB.

According to the first method, if it is desired to make VNN and VBB different, it is necessary to increase an output drive capacity in a VNN generating circuit for canceling charges supplied by the coupling capacitance to drive the voltages into further desired voltages. Thus, it is necessary to increase a circuit scale related to the VNN generating circuit.

FIG. 6 is a time chart showing a change in voltage waveform of each part of a semiconductor integrated circuit device according to a second method (corresponding to FIG. 4 of Patent Document 2). In FIG. 6, the explanations of the process until time T2 are omitted because it is same as that in FIG. 5. At time T2 when VPLT reaches the electric potential V4, the clamp of VBB to GND is cancelled to reduce VPLT to the normal predetermined electric potential V5 (voltage drop state). VBB decreases from GND toward a negative voltage by capacitive coupling, since it is coupled through the coupling capacitance of VPLT and VBB. After time T2, the electric potential of VBB ultimately reaches the predetermined negative electric potential V7 due to depressing by the drive capacity of the VBB generating circuit itself and the coupling capacitance with VPLT (at time T3). After time T3, VBB is driven so as to be kept at the predetermined negative electric potential V7.

Furthermore, VNN is clamped to GND until time T3, and the clamp of VNN to CND is cancelled at time T3. After time T3, VNN ultimately reaches a predetermined negative electric potential V6 due to the drive capacity of the VNN generating circuit itself (at time T4). After time T4, VNN is driven so as to be kept at the predetermined negative electric potential V6.

According to the second method, there is the concern that time for completion of the setup is prolonged to time T4, thus making it difficult for VNN to reach a predetermined negative electric potential within a time period defined by specifications.

As described above, in the related art, there is the concern that an output voltage cannot be set to a desired voltage within a predetermined time period without increasing the circuit scale of the voltage generating circuit. In this connection, explanations have been presented for VBB and VNN in the above description, but the same applies for combinations of internal voltages other than VBB and VNN.

SUMMARY OF THE INVENTION

A semiconductor integrated circuit device according to one exemplary aspect of the present invention comprises:

a first voltage generating circuit that is driven for a predetermined voltage at the time of setup;

a second voltage generating circuit outputting a voltage between an output voltage of the first voltage generating circuit and a ground voltage;

a first coupling capacitance existing between output terminals of the first and second voltage generating circuits; and a current supplying circuit supplying a current to the output terminal of the second voltage generating circuit so as to reduce an electric potential of the output terminal toward the ground voltage.

According to the present invention, an electric potential of an output terminal of a second voltage generating circuit decreases toward a ground voltage at the time of setup, thus making it possible to set an output voltage of the second voltage generating circuit to a desired voltage within a predetermined time period without increasing the circuit scale of the second voltage generating circuit.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENT

Figure 1:
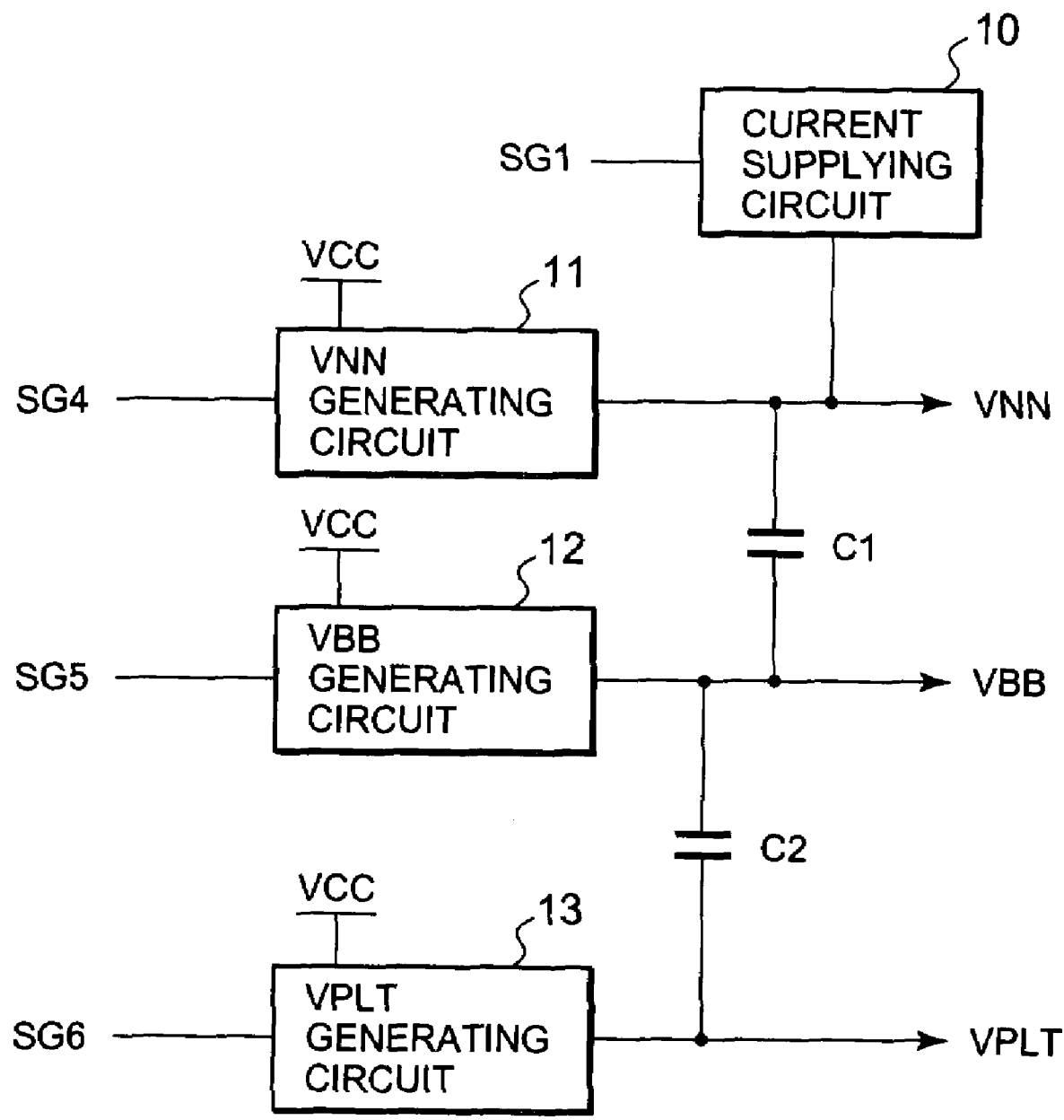
FIG. 1 is a block diagram showing a configuration of a semiconductor integrated circuit device according to a first embodiment of the present invention.

A semiconductor integrated circuit device according to an embodiment of the present invention comprises:

a first voltage generating circuit (reference numeral 12 of FIG. 1) that is driven for a predetermined voltage at the time of setup;

a second voltage generating circuit (reference numeral 11 of FIG. 1) outputting a voltage between an output voltage of the first voltage generating circuit and a ground voltage;

a first coupling capacitance (reference symbol C1 of FIG. 1) existing between output terminals of the first and second voltage generating circuits; and a current supplying circuit (reference numeral 10 of FIG. 1) supplying a current to the output terminal of the second voltage generating circuit so as to reduce an electric potential of the output terminal toward the ground voltage.

The first voltage generating circuit may have the output terminal driven by an overdrive power supply and a second coupling capacitance (reference symbol C2 of FIG. 1) at the time of drop in voltage after overdrive of the overdrive power supply at the time of setup, and the current supplying circuit may supply a current at the time of drop in voltage after overdrive.

A current supply capacity in the current supplying circuit (reference numeral 10 of FIG. 1) is preferably set to be low as compared to a current drive capacity in the output of the second voltage generating circuit (reference numeral 11 of FIG. 1).

Furthermore, the current supplying circuit (reference numeral 10 of FIG. 1) is preferably controlled so as to supply a current until the output voltage of the first voltage generating circuit reaches a predetermined voltage and stop the supply of the current when the predetermined voltage is reached.

Further, the current supplying circuit (reference numeral 10 of FIG. 1) may be formed of a series circuit of a transistor and a resistor, which has one end connected to the output terminal of the second voltage generating circuit (reference numeral 11 of FIG. 1) and the other end connected to a predetermined power supply, and the transistor may be turned on at the time of supply of a current. The current supplying circuit may comprise a level shift circuit converting an input control signal into a signal for performing ON/OFF control of the transistor.

Further, the electric potential of the predetermined power supply may be the ground electric potential. Furthermore, the electric potential of the predetermined power supply may be opposite in polarity to the electric potential outputted by the second voltage generating circuit. The present invention will be described in detail below based on examples with reference to the drawings.

Embodiment 1

FIG. 1 is a block diagram showing a configuration of a semiconductor integrated circuit device according to the first embodiment of the present invention. In FIG. 1, the semiconductor integrated circuit device comprises a current supplying circuit 10, a VNN generating circuit 11, a VBB generating circuit 12, a VPLT generating circuit 13 and capacitances C1 and C2. The current supplying circuit 10 operates by a control signal SG1, and supplies a current to an output of the VNN generating circuit 11. In this connection, a current supply capacity in the current supplying circuit 10 is set to be low as compared to a current drive capacity in the output of the VNN generating circuit 11. The VNN generating circuit 11 operates by an activating signal SG4, and outputs by a built-in charge pump circuit or the like an internal voltage VNN for reset of a word line, which is at a negative electric potential. The VBB generating circuit 12 operates by an activating signal SG5, and outputs by a built-in charge pump circuit or the like an internal voltage VBB for a back gate bias, which is at a negative electric potential. The VPLT generating circuit 13 operates by an activating signal SG6, and outputs by an built-in charge pump circuit or the like an internal voltage VPLT for a cell plate, which is at a positive electric potential, based on a power supply voltage VCC.

When each of these activating signals SG4 to SG6 is at a low level, each of the VNN generating circuit 11, the VBB generating circuit 12 and the VPLT generating circuit 13 is inactive, and the output voltages are fixed to GND. Furthermore, when each of the activating signals SG4 to SG6 is at a high level, each of the VNN generating circuit 11, the VBB generating circuit 12 and the VPLT generating circuit 13 is active, and the output voltages are each driven toward a predetermined electric potential. The outputs of the VNN generating circuit 11 and the VBB generating circuit 12 operate so that after reaching predetermined electric potentials, respectively, they are stably controlled at the electric potentials. Furthermore, the output of the VPLT generating circuit 13 operates so that it is once overdriven to above a predetermined electric potential, drops in voltage toward the predetermined electric potential, and is stably controlled at the predetermined electric potential.

The coupling capacitance C1 including a parasitic capacitance, a stabilization capacitance and the like exists between the outputs of the VNN generating circuit 11 and the VBB generating circuit 12. Furthermore, the coupling capacitance C2 including a parasitic capacitance, a stabilization capacitance and the like exists between the VBB generating circuit 12 and the VPLT generating circuit 13. Further, VBB and VNN are negative voltages of different electric potentials, and the output voltages of the internal voltage generating circuits have a relationship in magnitude of VCC>VPLT>GND>VNN>VBB.

Figure 2:
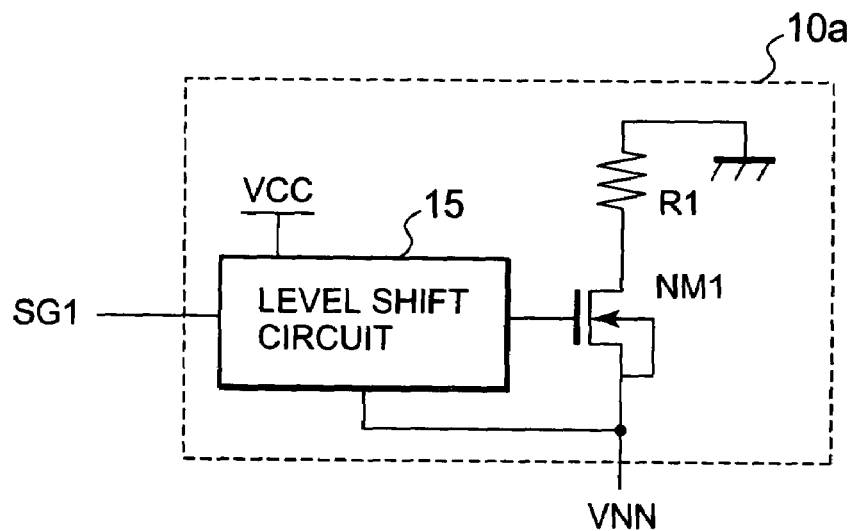
FIG. 2 is a circuit diagram of a current supplying circuit according to the first embodiment of the present invention.

FIG. 2 is a circuit diagram of a current supplying circuit according to the first embodiment of the present invention. The current supplying circuit 10a comprises an Nch transistor NM1, a resistor R1 and a level shift circuit 15. The Nch transistor NM1 connects a source to VNN, connects a drain to GND through the resistor R1, and connects a gate to an output of the level shift circuit 15. The level shift circuit 15 is a circuit level-converting a voltage between VCC and GND in the control signal SG1 into a voltage between GND and VNN to perform ON/OFF control of the Nch transistor NM1. When the control signal SG1 is at a low level (GND level), the Nch transistor NM1 is turned off to supply no current to VNN. When the control signal SG1 is at a high level (VCC level), the Nch transistor NM1 is turned on to supply a current from GND to VNN through the resistor R1.

Figure 3:
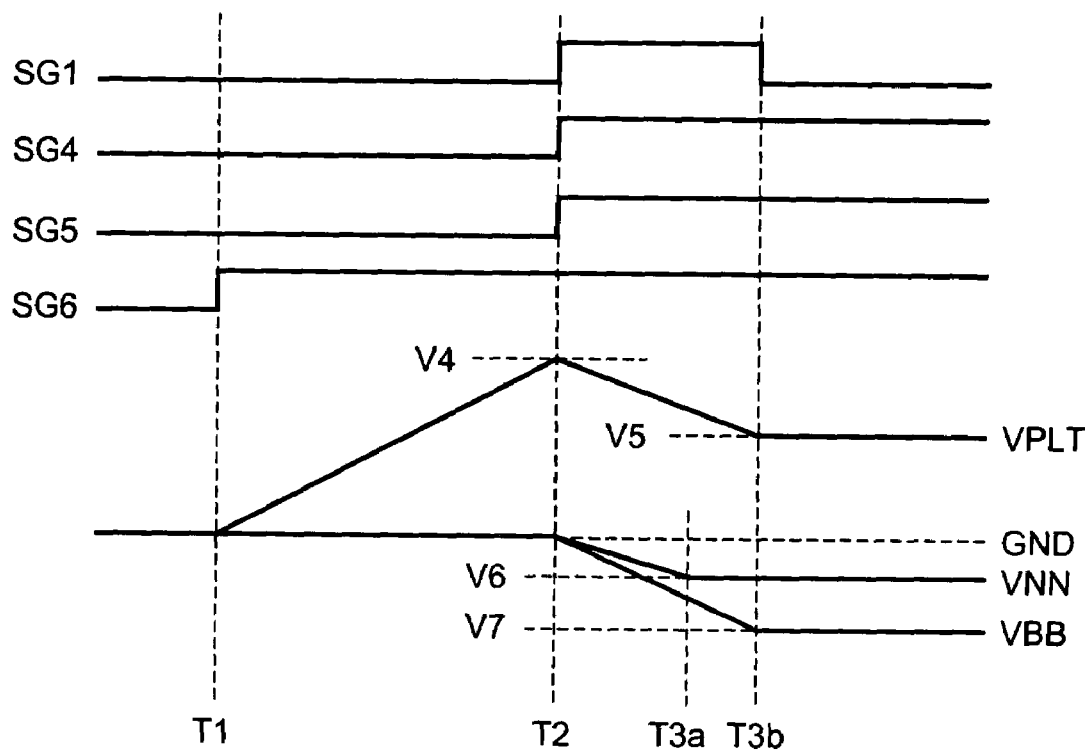
FIG. 3 is a time chart showing a change in voltage waveform of each part of the semiconductor integrated circuit device in a power-on setup operation according to the first embodiment of the present invention.

FIG. 3 is a time chart showing a change in voltage waveform of each part of the semiconductor integrated circuit device in a power-on setup operation. In FIG. 3, VPLT, VBB and VNN are fixed to GND until time T1. At time T1, the activating signal SG6 changes from a low level to a high level, and the VPLT generating circuit 13 is thereby activated to start an operation. VPLT which is an output voltage of the VPLT generating circuit 13 is increased toward an electric potential V4 higher than a normal predetermined electric potential V5 (overdrive operation).

When VPLT reaches the electric potential V4 at time T2, the VPLT generating circuit 13 stops the overdrive operation. In this connection, in the overdrive operation at time T1 to T2, VBB and VNN are fixed to GND (Clamp state).

At time T2 when VPLT reaches the electric potential V4, the clamp of VBB and VNN to GND is cancelled to reduce VPLT to the normal predetermined electric potential V5 (voltage drop state). Since VBB in a cell well region is coupled to VPLT in a cell plate region through the coupling capacitance C2, VBB decreases from GND toward a negative voltage by capacitive coupling C2. After time T2, the electric potential of VBB ultimately reaches a predetermined negative electric potential V7 due to depressing by the drive capacity of the VBB generating circuit 12 itself and the coupling capacitance C1 with VPLT (at time T3b), since the VBB generating circuit 12 is activated. After time T3b, VBB is driven so as to be kept at the predetermined negative electric potential V7 by the VBB generating circuit 12.

Furthermore, at time T2, the VNN generating circuit 11 and the current supplying circuit 10 are also activated. Since the coupling capacitance C1 exists between VNN and VBB, the electric potential of VNN decreased by capacitive coupling C1, following a reduction in VBB. At this time, a current supplied from the activated current supplying circuit 10 is injected into the output terminal of the VNN generating circuit 11, and VNN takes on an electric potential at a midpoint between VBB and GND. The VNN generating circuit 11 operates so that a predetermined negative electric potential V6 is reached at time T3a by its own current drive capacity, and the electric potential of VNN after time T3a is kept at the predetermined negative electric potential V6. At time T3b, the control signal SG1 changes from a high level to a low level, so that the current supplying circuit 10 stops the supply of a current.

The current supplying circuit 10, the VNN generating circuit 11, the VBB generating circuit 12 and the VPLT generating circuit 13 operate in the manner as described above to complete a series of power-on setup operations.

Generally, if the capacitance C exists between internal voltages set at different electric potentials, the supply of a charge consistent with "C×ΔV" is required for producing a potential difference ΔV between the internal voltages. Conventionally, this charge is supplied by the current drive capacity of the internal voltage generating circuit. However, for implementation of an internal voltage generating circuit having a current drive capacity sufficient to drive a voltage into a predetermined electric potential with in a time period defined by specifications while charging a capacitance parasitic on the output of the internal voltage generating circuit at the time of power-on setup operation, the area of the circuit is necessarily increased.

On the contrary, there is the current supplying circuit, and a charge necessary for producing a potential difference is supplied from outside (ground side) at the time of power-on setup operation. The current supplying circuit consists of a transistor and a resistor, and an increase in the area of the circuit is extremely small as compared to a case where a capacitive element in the internal voltage generating circuit is increased. Therefore, it is possible to drive the voltage into a predetermined electric potential within a time period defined by specifications with almost no increase in circuit scale of the semiconductor integrated circuit device.

Embodiment 2

Figure 4:
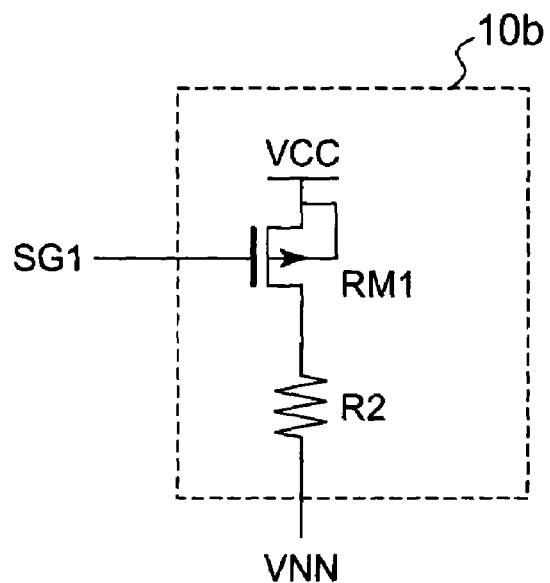
FIG. 4 is a circuit diagram of the current supplying circuit according to a second embodiment of the present invention.
Figure 5:
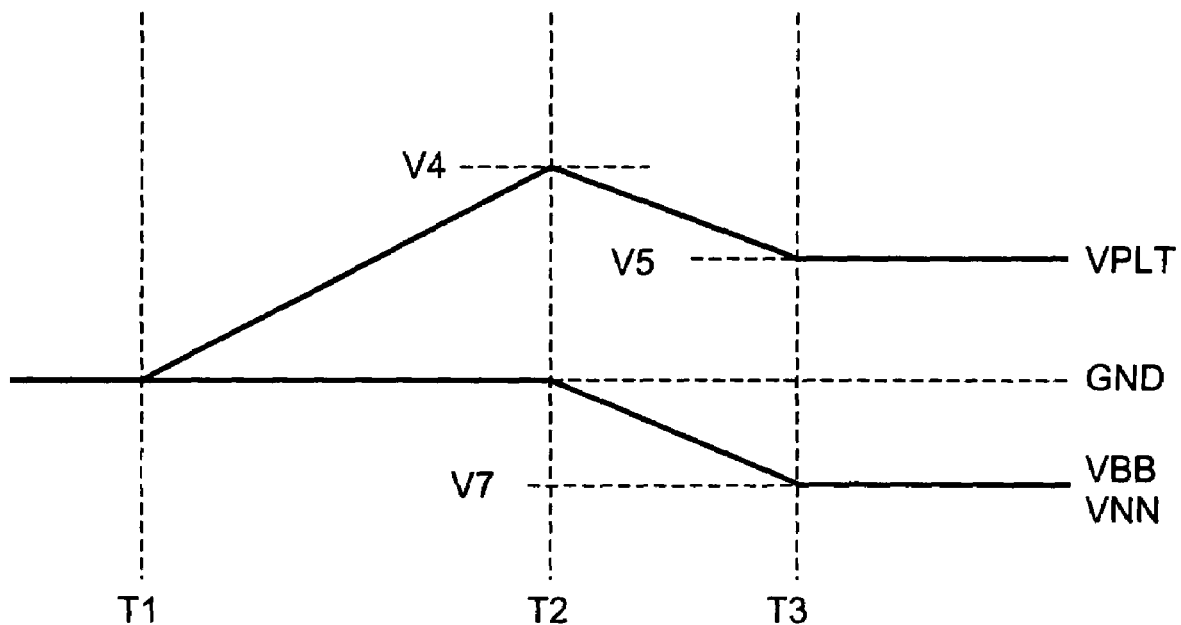
FIG. 5 is a time chart showing a change in voltage waveform of each part of the semiconductor integrated circuit device in a power-on setup operation of a related art.
Figure 6:
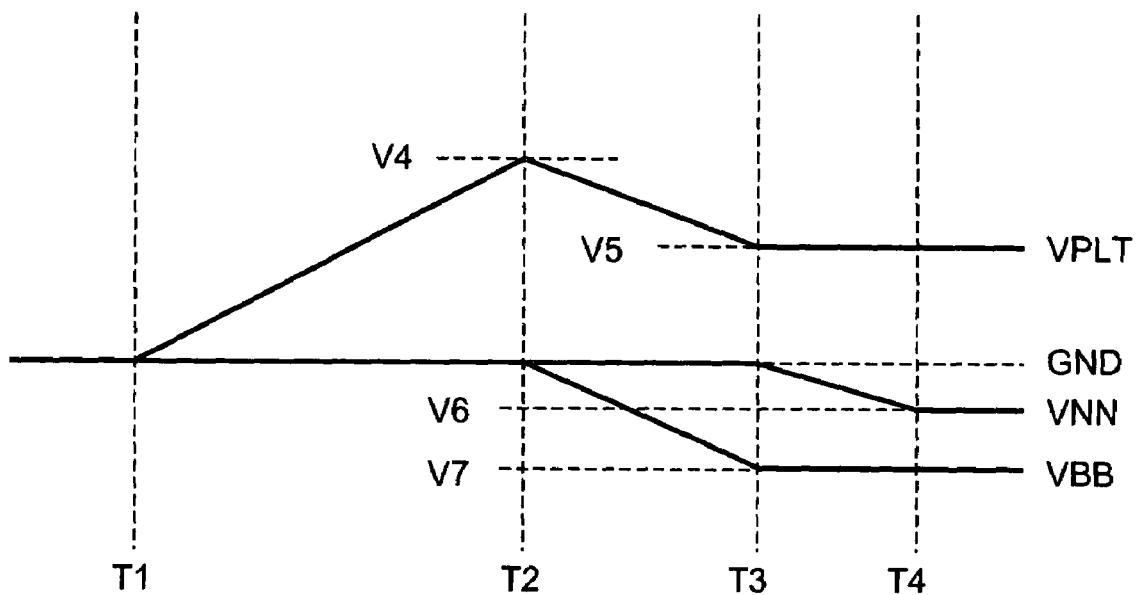
FIG. 6 is another time chart showing a change in voltage waveform of each part of the semiconductor integrated circuit device in a power-on setup operation of a related art.

FIG. 4 is a circuit diagram of a current supplying circuit of the second embodiment of the present invention. A current supplying circuit 10b comprises a Pch transistor PM1 and a resistor R2. The Pch transistor PM1 connects a source to VCC as an external power supply, connects a drain to VNN through the resistor R2, and supplies a control signal SG1 to a gate. When the control signal SG1 is at a high level (VCC level), the Pch transistor PM1 is turned off to supply no current to VNN. When the control signal SG1 is at a low level (GND level), the Pch transistor PM1 is turned on to supply a current from the power supply VCC to VNN through the resistor R2. In this connection, here, the waveform of the control signal SG1 shown in FIG. 3 is represented with the low level and the high level inverted.

The current supplying circuit 10b constructed as described above operates in a manner similar to the current supplying circuit 10a shown in FIG. 2. However, the former is different from the latter in that a current is supplied to VNN from VCC. Namely, in the first embodiment, if a potential difference between VNN and GND is small, the Nch transistor NM1 operates in a region where a source drain voltage Vds is low. Thus, if it is desired to set a sullied current to be high, namely it is desired to set an on-current Ion of the Nch transistor NM1 to be high, the gate width of the Nch transistor NM1 should be increased, leading to an increase in the area of the circuit. In the second embodiment, it is not necessary to increase the Pch transistor PM1, since the source drain voltage Vds of the Pch transistor PM1 can be adequately secured. Furthermore, since the amplitude level of the control signal SG1 controlling the Pch transistor PM1 falls between Vcc and GND, the level shift circuit 15 in FIG. 2 is not required, and thus the number of circuit elements can be reduced.

In the above embodiments, control of negative internal voltages has been described, but a similar construction is possible for control of a plurality of positive internal voltages of different electric potentials. Namely, even if there are two positive internal voltages of different electric potentials, the internal voltages are coupled by a capacitance, and the current drive capacity of their internal voltage generating circuits is low, a drive characteristic at the time of power-on setup can be improved by similar means.

Furthermore, a similar operation is possible for a reset setup operation from deep power-down as well as for the power-on setup operation.

In this connection, in the invention, overdrive in the VPLT generating circuit 13 is not essential. Namely, overdrive is applicable when there are a plurality of internal voltages rising or dropping in the same direction, and the internal voltages are coupled by a parasitic capacitance and required to be set to mutually different voltages. Of the internal voltages, those closer to the ground voltage may be supplied with a current by the current supplying circuit, and those less close to the ground voltage may be driven by overdrive, or the current drive capacity of the internal voltage generating circuit itself may be increased.

The present invention has been described based on the above exemplary embodiments, but the present invention is not limited only to the above examples, and includes various kinds of alterations and modifications that could be achieved by a person skilled in the art within the scope of the invention of each of claims of this application as a matter of course.

Further, it is noted that, Applicant's intent is to encompass equivalents of all claim elements, even if amended later during prosecution

What is claimed is:

1. A semiconductor integrated circuit device, comprising:
    a first voltage generating circuit that is driven at a time of power-on setup, the first voltage generating circuit outputting a first output voltage transiting from a ground voltage potential to a first voltage potential lower than the ground voltage potential, the first voltage generating circuit finally maintaining the first output voltage having the first voltage potential, at a first output terminal;
    a second voltage generating circuit which outputs a second output voltage transiting from the ground voltage potential to a second voltage potential lower than the ground voltage potential and higher than the first voltage potential, the second voltage generating circuit finally maintaining the second output voltage having the second voltage potential, at a second output terminal;
    a first coupling capacitance which exists between the first output terminal and the second output terminal; and
    a current supplying circuit which supplies a current to the second output terminal of said second voltage generating circuit so as to reduce an electric potential of the second output terminal toward the ground voltage.

2. The semiconductor integrated circuit device according to claim 1,
    wherein said first voltage generating circuit includes the first output terminal driven by a second coupling capacitance with an overdrive power supply at a time of drop in voltage after overdrive of said overdrive power supply at the time of setup, and said current supplying circuit supplies said current at the time of drop in voltage after said overdrive.

3. The semiconductor integrated circuit device according to claim 1,
wherein a current supply capacity in said current supplying circuit is set to be lower than a current drive capacity in the output of said second voltage generating circuit.

4. The semiconductor integrated circuit device according to claim 1,
wherein said current supplying circuit is controlled so as to supply the current until the first output voltage reaches the first voltage potential.

5. The semiconductor integrated circuit device as claimed in claim 4, wherein said current supplying circuit stops the supply of the current when the first output voltage reaches the first voltage potential.

6. The semiconductor integrated circuit device according to claim 4,
wherein said current supplying circuit comprises a series circuit of a transistor and a resistor, which includes one end connected to the second output terminal and another end connected to a predetermined power supply, and the transistor is turned on at the time of supply of the current.

7. The semiconductor integrated circuit device according to claim 6, wherein the electric potential of said predetermined power supply comprises the ground voltage potential.

8. The semiconductor integrated circuit device according to claim 6, wherein an electric potential of said predetermined power supply is opposite in polarity to an electric potential outputted by said second voltage generating circuit.

9. The semiconductor integrated circuit device according to claim 6, wherein said current supplying circuit comprises a level shift circuit converting an input control signal into a signal for performing ON/OFF control of said transistor.

10. The device as claimed in claim 1, wherein the first voltage generating circuit comprises a VBB voltage generating circuit which produces the first voltage, wherein the first voltage is a VBB voltage for a back bias of a cell transistor, and the second voltage generating circuit comprises a VNN voltage generating circuit which produces the second voltage, wherein the second voltage is a VNN voltage for a word line reset.

11. A semiconductor device, comprising:
a first voltage generator which outputs a first signal transiting from a ground voltage potential to a first voltage potential lower than the ground voltage potential, the first voltage generating circuit finally maintaining the first signal having the first voltage potential, to a first node,
a second voltage generator which outputs a second signal transiting from the ground voltage potential to a second voltage potential lower than the ground voltage potential and higher than the first voltage potential, the second voltage generating circuit finally maintaining the second signal having the second voltage potential, at a second output terminal, to a second node;
a capacitor coupled between said first and second nodes; and
a current supply circuit coupled to said second node;
wherein, while said first voltage generator outputs said first signal to set said first node to the first voltage potential, said second voltage generator is activated to output said second signal to set said second node to the second voltage potential, and at that time, said current supplying circuit supplies a current to the second node to suppress influence of a coupling capacitance by said capacitor.

12. The device as claimed in claim 11, further comprising:
a third voltage generator which outputs a third signal to a third node; and
a second capacitor coupled between said first and third nodes,
wherein said current supply circuit supplies said current during a period when a potential of said third node transitions to a predetermined voltage potential.

13. The device as claimed in claim 12, wherein said period is a period when said potential of said third node transitions from an over drive voltage potential.

14. The device as claimed in claim 11, wherein said current supply circuit is activated during a first period and a second period following said first period, said first period comprising a period when a potential of said second node reaches said first voltage potential, and said second period comprising a period from when said second voltage potential is maintained until said potential of said third node reaches said predetermined voltage potential.

15. The device as claimed in claim 14, wherein a voltage slope at said first node is substantially same as a voltage slope at said third node during said first and second periods.

16. The device as claimed in claim 11, wherein the first voltage generator circuit comprises a VBB voltage generator which produces the first signal, wherein the first signal is a VBB voltage for a back bias of a cell transistor, and the second voltage generator comprises a VNN voltage generator which produces the second signal, wherein the second signal is a VNN voltage for a word line reset.

17. The device as claimed in claim 13, wherein the third signal has a voltage potential higher than ground voltage and lower than the over drive voltage potential.

18. A semiconductor device, comprising:
a first voltage generator which receives a first control signal, and is activated by said first control signal to output a first signal to a first node;
a second voltage generator which receives a second control signal, and is activated by said second control signal to output a second signal transiting from a ground voltage potential to a first voltage potential lower than the ground voltage potential, the second voltage generator finally maintaining the second signal having the first voltage potential, to a second node;
a third voltage generator which receives a third control signal, and is activated by said third control signal to output a third signal transiting from the ground voltage potential to a second voltage potential lower than the ground voltage potential and higher than the first voltage potential, the third voltage generator finally maintaining the third signal having the second voltage potential, at a second output terminal, to a third node;
a first capacitor coupled between said first and second nodes;
a second capacitor coupled between said second and third nodes; and
a current supply circuit which receives a fourth control signal, and is activated by said fourth control signal to supply a current to said third node.

19. The device as claimed in claim 18, wherein said current supply circuit is activated during a period from when said second voltage generator is activated until a potential of said second node becomes the first voltage potential.

20. The device as claimed in claim 18, wherein said first voltage generator is activated to set said first node to an overdrive voltage potential, and then to set said first node to a desired voltage potential higher than ground voltage and lower than the overdrive voltage potential, and
wherein said current supply circuit is activated during a period when a potential of said first node transitions from said overdrive voltage potential to said desired voltage potential.

21. The device as claimed in claim 20, wherein said current supply circuit is activated during a first period and a second period following said first period, said first period comprising a period when a potential of said second node reaches said first voltage potential, and said second period comprising a period when said first voltage potential is maintained until said potential of said first node reaches said desired voltage potential.

22. The device as claimed in claim 21, wherein a voltage slope at said first node is substantially same as a voltage slope at said third node during said first and second period.

23. The device as claimed in claim 18, wherein the first voltage generator comprises a VPLT voltage generator which produces a VPLT voltage for a cell plate, the second voltage generator circuit comprises a VBB voltage generator which produces the second signal, wherein the second signal is a VBB voltage for a back bias of a cell transistor, and the third voltage generator comprises a VNN voltage generator which produces the third signal, wherein the third signal is a VNN voltage for a word line reset.

* * * * *